(12) United States Patent
Vitale et al.

(10) Patent No.: US 8,385,445 B2
(45) Date of Patent: Feb. 26, 2013

(54) METHOD FOR PROCESSING DIGITAL SIGNALS, AND TRANSMISSION/RECEPTION SYSTEM IMPLEMENTING SAID METHOD

(75) Inventors: Giovanni Vitale, Ostuni (IT); Vittoria Mignone, Piobesi Torinese (IT)

(73) Assignee: RAI Radiotelevisione Italia S.p.A., Rome (IT)

( * ) Notice: Subject to any disclaimer, the term of this patent is extended or adjusted under 35 U.S.C. 154(b) by 289 days.

(21) Appl. No.: 12/999,274

(22) PCT Filed: Jun. 8, 2009

(86) PCT No.: PCT/IB2009/005886
§ 371 (c)(1),
(2), (4) Date: Jan. 20, 2011

(87) PCT Pub. No.: WO2010/004382
PCT Pub. Date: Jan. 14, 2010

(65) Prior Publication Data
US 2011/0122960 A1    May 26, 2011

(30) Foreign Application Priority Data
Jun. 16, 2008 (IT) .............................. TO2008A0472

(51) Int. Cl.
*H04L 5/12* (2006.01)
*H03K 9/10* (2006.01)
(52) U.S. Cl. .................... 375/261; 375/298; 375/323
(58) Field of Classification Search .................. 375/261, 375/264, 298, 323; 714/752
See application file for complete search history.

(56) References Cited

U.S. PATENT DOCUMENTS

| 2006/0156169 | A1 | 7/2006 | Shen et al. | |
| 2009/0180495 | A1* | 7/2009 | Li et al. ......................... | 370/479 |
| 2009/0187804 | A1* | 7/2009 | Shen et al. .................... | 714/752 |
| 2009/0199065 | A1* | 8/2009 | Djordjevic et al. ........... | 714/752 |
| 2010/0157901 | A1* | 6/2010 | Sanderovitz et al. ......... | 370/328 |
| 2012/0250788 | A1* | 10/2012 | Walton et al. ................. | 375/295 |

FOREIGN PATENT DOCUMENTS

EP    2 056 549    5/2009

OTHER PUBLICATIONS

Takashi Yokokawa et al., *Parity and Column Twist Bit Interleaver for DVB-T2 LDPC Codes*, 2008 5$^{th}$ International Symposium on Turbo Codes and Related Topics, Sep. 1, 2008, pp. 123-127.
Jia Minli et al., *Enhanced HARQ Schemes Based on LDPC Coded Irregular Modulation*, IEEE 2007 International Symposium on Microwave, Antenna, Propagation, and EMC Technologies for Wireless Communications, IEEE, Aug. 2007, pp. 1088-1092.
PCT/IB2009/005886, Apr. 28, 2010, International Search Report.
PCT/IB2009/005886, Apr. 28, 2010, Written Opinion.
PCT/IB2009/005886, Sep. 6, 2010, International Report on Patentability.

* cited by examiner

*Primary Examiner* — Don N Vo
(74) *Attorney, Agent, or Firm* — Workman Nydegger

(57) ABSTRACT

The present invention relates to a method for processing digital signals and to a transmission/reception system implementing said method; the present invention is based on the use of LDPC codes, in particular the LDPC code of the DVB-S2 standard, in combination with a QAM modulation, in particular the 1024QAM and 4096QAM modulations; in transmission, a bit permutation (Demux) is carried out prior to the QAM constellation mapping function; in reception, the bit permutation is carried out after the QAM constellation demapping function.

4 Claims, 11 Drawing Sheets

Fig. 8a

|  | Symbol 1 | | | | | | Symbol 2 | | | | |
|---|---|---|---|---|---|---|---|---|---|---|---|
| $I_{y,1}$ | y0 | y2 | y4 | y6 | y8 | $I_{y,2}$ | y10 | y12 | y14 | y16 | y18 |
| $I_{b,1}$ | b8 | b6 | b4 | b2 | b0 | $I_{b,2}$ | b9 | b7 | b5 | b3 | b1 |
| $Q_{y,1}$ | y1 | y3 | y5 | y7 | y9 | $Q_{y,2}$ | y11 | y13 | y15 | y17 | y19 |
| $Q_{b,1}$ | b10 | b12 | b14 | b16 | b18 | $Q_{b,2}$ | b11 | b13 | b15 | b17 | b19 |

Fig. 8b

|  | Symbol 1 | | | | | | Symbol 2 | | | | |
|---|---|---|---|---|---|---|---|---|---|---|---|
| $I_{y,1}$ | y0 | y2 | y4 | y6 | y8 | $I_{y,2}$ | y10 | y12 | y14 | y16 | y18 |
| $I_{b,1}$ | b8 | b6 | b4 | b2 | b0 | $I_{b,2}$ | b9 | b7 | b5 | b1 | b3 |
| $Q_{y,1}$ | y1 | y3 | y5 | y7 | y9 | $Q_{y,2}$ | y11 | y13 | y15 | y17 | y19 |
| $Q_{b,1}$ | b10 | b12 | b14 | b16 | B18 | $Q_{b,2}$ | b19 | b13 | b15 | b17 | b11 |

Fig. 8c

|  | Symbol 1 | | | | | | Symbol 2 | | | | |
|---|---|---|---|---|---|---|---|---|---|---|---|
| $I_{y,1}$ | y0 | y2 | y4 | y6 | y8 | $I_{y,2}$ | y10 | y12 | y14 | y16 | y18 |
| $I_{b,1}$ | b8 | b6 | b4 | b2 | b0 | $I_{b,2}$ | b9 | b7 | b5 | b1 | b3 |
| $Q_{y,1}$ | y1 | y3 | y5 | y7 | y9 | $Q_{y,2}$ | y11 | y13 | y15 | y17 | y19 |
| $Q_{b,2}$ | b19 | b13 | b15 | b17 | b11 | $Q_{b,1}$ | b10 | b12 | b14 | b16 | b18 |

Fig. 8d

|  | Symbol 1 | | | | | | Symbol 2 | | | | |
|---|---|---|---|---|---|---|---|---|---|---|---|
| $I_{y,1}$ | y0 | y2 | y4 | y6 | y8 | $I_{y,2}$ | y10 | y12 | y14 | y16 | y18 |
| $I_{b,1}$ | b8 | b13 | b4 | b17 | b0 | $I_{b,2}$ | b10 | b7 | b14 | b1 | b18 |
| $Q_{y,1}$ | y1 | y3 | y5 | y7 | y9 | $Q_{y,2}$ | y11 | y13 | y15 | y17 | y19 |
| $Q_{b,1}$ | b19 | b6 | b15 | b2 | b11 | $Q_{b,2}$ | b9 | b12 | b5 | b16 | b3 |

Fig. 9a

|  | Symbol 1 | | | | | |  | Symbol 2 | | | | | |
|---|---|---|---|---|---|---|---|---|---|---|---|---|---|
| $I_{y,1}$ | y0 | y2 | y4 | y6 | y8 | y10 | $I_{y,2}$ | y12 | y14 | y16 | y18 | y20 | y22 |
| $I_{b,1}$ | b10 | b8 | b6 | b4 | b2 | b0 | $I_{b,2}$ | b11 | b9 | b7 | b5 | b3 | b1 |
| $Q_{y,1}$ | y1 | y3 | y5 | y7 | y9 | y11 | $Q_{y,2}$ | y13 | y15 | y17 | y19 | y21 | y23 |
| $Q_{b,1}$ | b12 | b14 | b16 | b18 | b20 | b22 | $Q_{b,2}$ | b13 | b15 | b17 | b19 | b21 | b23 |

Fig. 9b

|  | Symbol 1 | | | | | |  | Symbol 2 | | | | | |
|---|---|---|---|---|---|---|---|---|---|---|---|---|---|
| $I_{y,1}$ | y0 | y2 | y4 | y6 | y8 | y10 | $I_{y,2}$ | y12 | y14 | y16 | y18 | y20 | y22 |
| $I_{b,1}$ | b10 | b8 | b6 | b4 | b2 | b0 | $I_{b,2}$ | b11 | b9 | b7 | b5 | b1 | b3 |
| $Q_{y,1}$ | y1 | y3 | y5 | y7 | y9 | y11 | $Q_{y,2}$ | y13 | y15 | y17 | y19 | y21 | y23 |
| $Q_{b,1}$ | b12 | b14 | b16 | b18 | b20 | b22 | $Q_{b,2}$ | b23 | b15 | b17 | b19 | b21 | b13 |

Fig. 9c

|  | Symbol 1 | | | | | |  | Symbol 2 | | | | | |
|---|---|---|---|---|---|---|---|---|---|---|---|---|---|
| $I_{y,1}$ | y0 | y2 | y4 | y6 | y8 | y10 | $I_{y,2}$ | y12 | y14 | y16 | y18 | y20 | y22 |
| $I_{b,1}$ | b10 | b8 | b6 | b4 | b2 | b0 | $I_{b,2}$ | b11 | b9 | b7 | b5 | b1 | b3 |
| $Q_{y,1}$ | y1 | y3 | y5 | y7 | y9 | y11 | $Q_{y,2}$ | y13 | y15 | y17 | y19 | y21 | y23 |
| $Q_{b,2}$ | b23 | b15 | b17 | b19 | b21 | b13 | $Q_{b,1}$ | b12 | b14 | b16 | b18 | b20 | b22 |

Fig. 9d

|  | Symbol 1 | | | | | |  | Symbol 2 | | | | | |
|---|---|---|---|---|---|---|---|---|---|---|---|---|---|
| $I_{y,1}$ | y0 | y2 | y4 | y6 | y8 | y10 | $I_{y,2}$ | y12 | y14 | y16 | y18 | y20 | y22 |
| $I_{b,1}$ | b10 | b15 | b6 | b19 | b2 | b13 | $I_{b,2}$ | b11 | b14 | b7 | b18 | b1 | b22 |
| $Q_{y,1}$ | y1 | y3 | y5 | y7 | y9 | y11 | $Q_{y,2}$ | y13 | y15 | y17 | y19 | y21 | y23 |
| $Q_{b,2}$ | b23 | b8 | b17 | b4 | b21 | b0 | $Q_{b,1}$ | b12 | b9 | b16 | b5 | b20 | b3 |

Fig. 10a: Mapping of the BPSK constellation points

| $y_{0,q}$ | 1 | 0 |
|---|---|---|
| $Re(z_q)$ | -1 | 1 |
| $Im(z_q)$ | 0 | 0 |

Fig. 10b: Mapping of the real portion of the QPSK constellation points

| $y_{0,q}$ | 1 | 0 |
|---|---|---|
| $Re(z_q)$ | -1 | 1 |

Fig. 10c: Mapping of the imaginary portion of the QPSK constellation points

| $y_{1,q}$ | 1 | 0 |
|---|---|---|
| $Im(z_q)$ | -1 | 1 |

Fig. 10d: Mapping of the real portion of the 16-QAM constellation points

| $Y_{0,q}$ | 1 | 1 | 0 | 0 |
|---|---|---|---|---|
| $y_{2,q}$ | 0 | 1 | 1 | 0 |
| $Re(z_q)$ | -3 | -1 | 1 | 3 |

Fig. 10e: Mapping of the imaginary portion of the 16-QAM constellation points

| $y_{1,q}$ | 1 | 1 | 0 | 0 |
|---|---|---|---|---|
| $y_{3,q}$ | 0 | 1 | 1 | 0 |
| $Im(z_q)$ | -3 | -1 | 1 | 3 |

Fig. 10f: Mapping of the real portion of the 64-QAM constellation points

| $y_{0,q}$ | 1 | 1 | 1 | 1 | 0 | 0 | 0 | 0 |
|---|---|---|---|---|---|---|---|---|
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | -7 | -5 | -3 | -1 | 1 | 3 | 5 | 7 |

Fig. 10g: Mapping of the imaginary portion of the 64-QAM constellation points

| $y_{1,q}$ | 1 | 1 | 1 | 1 | 0 | 0 | 0 | 0 |
|---|---|---|---|---|---|---|---|---|
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| $Im(z_q)$ | -7 | -5 | -3 | -1 | 1 | 3 | 5 | 7 |

Fig. 10h: Mapping of the real portion of the 256-QAM constellation points

| $y_{0,q}$ | 1 | 1 | 1 | 1 | 1 | 1 | 1 | 1 | 0 | 0 | 0 | 0 | 0 | 0 | 0 | 0 |
|---|---|---|---|---|---|---|---|---|---|---|---|---|---|---|---|---|
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | -15 | -13 | -11 | -9 | -7 | -5 | -3 | -1 | 1 | 3 | 5 | 7 | 9 | 11 | 13 | 15 |

Fig. 10i: Mapping of the imaginary portion of the 256-QAM constellation points

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 |
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $Im(z_q)$ | -15 | -13 | -11 | -9 | -7 | -5 | -3 | -1 | 1 | 3 | 5 | 7 | 9 | 11 | 13 | 15 |

Fig. 10j: Mapping of the real portion of the 1024-QAM constellation points

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | -31 | -29 | -27 | -25 | -23 | -21 | -19 | -17 | -15 | -13 | -11 | -9 | -7 | -5 | -3 | -1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |

Fig. 10k: Mapping of the imaginary portion of the 1024-QAM constellation points

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | -31 | -29 | -27 | -25 | -23 | -21 | -19 | -17 | -15 | -13 | -11 | -9 | -7 | -5 | -3 | -1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |

Fig. 10l: Mapping of the real portion of the 4096-QAM constellation points

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | -63 | -61 | -59 | -57 | -55 | -53 | -51 | -49 | -47 | -45 | -43 | -41 | -39 | -37 | -35 | -33 |
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | -31 | -29 | -27 | -25 | -23 | -21 | -19 | -17 | -15 | -13 | -11 | -9 | -7 | -5 | -3 | -1 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 1 | 1 | 1 | 1 | 1 | 1 | 1 | 1 |
| $y_{4,q}$ | 0 | 0 | 0 | 0 | 0 | 0 | 0 | 0 | 1 | 1 | 1 | 1 | 1 | 1 | 1 | 1 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 1 | 3 | 5 | 7 | 9 | 11 | 13 | 15 | 17 | 19 | 21 | 23 | 25 | 27 | 29 | 31 |
| $y_{0,q}$ | 0 | 0 | 0 | 0 | 0 | 0 | 0 | 0 | 0 | 0 | 0 | 0 | 0 | 0 | 0 | 0 |
| $y_{2,q}$ | 0 | 0 | 0 | 0 | 0 | 0 | 0 | 0 | 0 | 0 | 0 | 0 | 0 | 0 | 0 | 0 |
| $y_{4,q}$ | 1 | 1 | 1 | 1 | 1 | 1 | 1 | 1 | 0 | 0 | 0 | 0 | 0 | 0 | 0 | 0 |
| $y_{6,q}$ | 0 | 0 | 0 | 0 | 1 | 1 | 1 | 1 | 1 | 1 | 1 | 1 | 0 | 0 | 0 | 0 |
| $y_{8,q}$ | 0 | 0 | 1 | 1 | 1 | 1 | 0 | 0 | 0 | 0 | 1 | 1 | 1 | 1 | 0 | 0 |
| $y_{10,q}$ | 0 | 1 | 1 | 0 | 0 | 1 | 1 | 0 | 0 | 1 | 1 | 0 | 0 | 1 | 1 | 0 |
| $Re(z_q)$ | 33 | 35 | 37 | 39 | 41 | 43 | 45 | 47 | 49 | 51 | 53 | 55 | 57 | 59 | 61 | 63 |

Fig. 10m: Mapping of the imaginary portion of the 4096-QAM constellation points

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | -63 | -61 | -59 | -57 | -55 | -53 | -51 | -49 | -47 | -45 | -43 | -41 | -39 | -37 | -35 | -33 |
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | -31 | -29 | -27 | -25 | -23 | -21 | -19 | -17 | -15 | -13 | -11 | -9 | -7 | -5 | -3 | -1 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 1 | 1 | 1 | 1 | 1 | 1 | 1 | 1 |
| $y_{5,q}$ | 0 | 0 | 0 | 0 | 0 | 0 | 0 | 0 | 1 | 1 | 1 | 1 | 1 | 1 | 1 | 1 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 1 | 3 | 5 | 7 | 9 | 11 | 13 | 15 | 17 | 19 | 21 | 23 | 25 | 27 | 29 | 31 |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 0 | 0 | 0 | 0 | 0 | 0 | 0 | 0 | 0 | 0 | 0 | 0 | 0 | 0 | 0 | 0 |
| $y_{5,q}$ | 1 | 1 | 1 | 1 | 1 | 1 | 1 | 1 | 0 | 0 | 0 | 0 | 0 | 0 | 0 | 0 |
| $y_{7,q}$ | 0 | 0 | 0 | 0 | 1 | 1 | 1 | 1 | 1 | 1 | 1 | 1 | 0 | 0 | 0 | 0 |
| $y_{9,q}$ | 0 | 0 | 1 | 1 | 1 | 1 | 0 | 0 | 0 | 0 | 1 | 1 | 1 | 1 | 0 | 0 |
| $y_{11,q}$ | 0 | 1 | 1 | 0 | 0 | 1 | 1 | 0 | 0 | 1 | 1 | 0 | 0 | 1 | 1 | 0 |
| $Im(z_q)$ | 33 | 35 | 37 | 39 | 41 | 43 | 45 | 47 | 49 | 51 | 53 | 55 | 57 | 59 | 61 | 63 |

METHOD FOR PROCESSING DIGITAL SIGNALS, AND TRANSMISSION/RECEPTION SYSTEM IMPLEMENTING SAID METHOD

FIELD OF THE INVENTION

Summary of the Invention

The present invention relates to a method for processing digital signals and to a transmission/reception system that implements said method.

The invention is intended mainly, but not exclusively, for receiving and transmitting digital audio and video signals, in particular those involved in the broadcasting of second-generation digital television signals over cable networks.

In order to protect the signals from the distortions of the transmission channel, the second-generation system for broadband satellite broadcasting (DVB-S2) utilizes the LDPC (Low Density Parity Check) encoding associated with the QPSK, 8PSK, 16APSK and 32APSK modulations, respectively shown in sequence in FIG. 1 from top to bottom and from left to right, which are suitable for transmission over a non-linear channel such as the satellite one. A description of the DVB-S2 standard and LDPC codes can be found, for example, in A. Morello, V. Mignone, "DVB-S2: The Second Generation Standard for Satellite Broad-band Services", Proceedings of the IEEE, Volume 94, Issue 1, Jan. 2006, pages 210-227.

For the purpose of better exploiting the potentiality of the codes, the DVB-S2 standard provides that an interleaver is interposed between the LDPC encoder and the 8PSK, 16APSK and 32APSK constellation mapper in order to achieve an improved association between the bits of the encoded word and the bits carried by the constellation points.

In the interleaver defined in the DVB-S2 standard, shown in FIG. 2, the encoded packet outputted by the LDPC encoder (formed by a number of bits equal to 16,200 or 64,800, which number is generally referred to with the symbol "$N_{FRAME}$") is written by columns in a matrix having N columns, where N is the number of bits carried by the constellation (N is 3 for 8PSK, 4 for 16APSK, 5 for 32APSK), and $N_{FRAME}/N$ rows, and is read by rows; reading takes place from left to right for all code rates provided by the standard, with the exception of the 3/5 rate, where reading takes place from right to left in the case of 8PSK modulation. The association with the constellation points or coordinates takes place as shown in FIG. 1.

Following the current trend in the broadcasting of second-generation digital terrestrial television signals, it has recently been thought of using the same encoding scheme as that employed in the DVB-S2 standard, i.e. the same LDPC codes, also for the reception and transmission of numerical audio and video signals involved in the broadcasting of second-generation digital television signals over cable networks, however associated with QAM (Quadrature Amplitude Modulation) modulations; in particular, cable network broadcasting utilizes the 1024QAM and 4096QAM modulations (FIG. 3b).

The Applicant has realised that, with QAM modulations, the performance offered by the LDPC codes of the DVB-S2 standard are good but not wholly satisfactory as to the signal-to-noise ratio (SNR) required for reaching the QEF (Quasi Error Free) condition; as known, such a condition corresponds to the case wherein less than one error is received per hour of received program.

The general object of the present invention is to solve the above-mentioned problem and, in particular, to improve the association between the bits outputted by the LDPC encoder and the constellation coordinates of QAM modulations; more in particular, the present invention deals with the LDPC encoding according to the DVB-S2 standard and with the 1024QAM and 4096QAM modulations.

Said objects are achieved through the method for processing digital signals and the transmission/reception system having the features set out in the appended claims, which are intended as an integral part of the present description.

BRIEF DESCRIPTION OF THE DRAWINGS

The invention will now be described in detail in some of its preferred embodiments, which are provided herein by way of non-limiting example, by referring to the annexed drawings, wherein:

FIGS. 8a to 8d show the method used for obtaining the function carried out by the "Demux" block of FIG. 4 according to the diagram shown in FIG. 6a;

FIGS. 9a to 9d show the method used for obtaining the function carried out by the "Demux" block of FIG. 4 according to the diagram shown in FIG. 7a;

FIGS. 10a to 10m show the mapping of the real and imaginary portions of the points of the QPSK, 16QAM, 64QAM, 256QAM, 1024QAM and 4096QAM constellations applicable to the reception and transmission of audio and video signals involved in the broadcasting of second-generation digital television signals over cable networks, wherein $z_q$ designates the vector that identifies the constellation point in the complex plane, with a real portion $Re(z_q)$ and an imaginary portion $Im(z_q)$, whereas $y_{i,q}$ designates the $i^{th}$ bit of the group of N bits which is mapped to the constellation point identified by $z_q$ (for 4096QAM, for example, N=12 and i=0, 1, 2, ..., 10, 11).

DETAILED DESCRIPTION OF THE PREFERRED EMBODIMENTS

Figure 4:
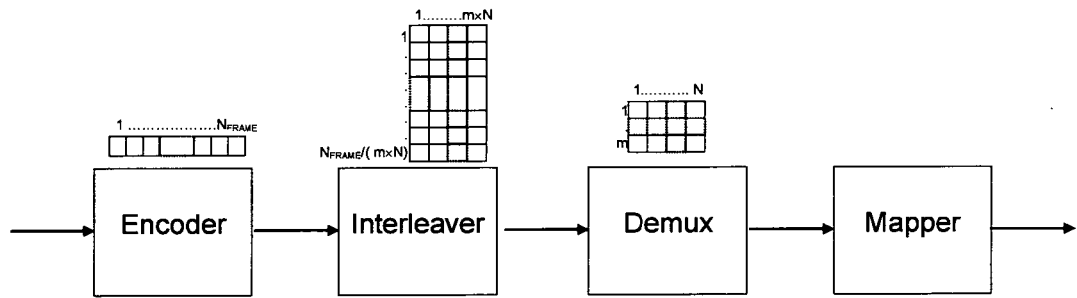
FIG. 4 is a much simplified block diagram of a system for processing a modulating digital signal according to the present invention.
Figure 5:
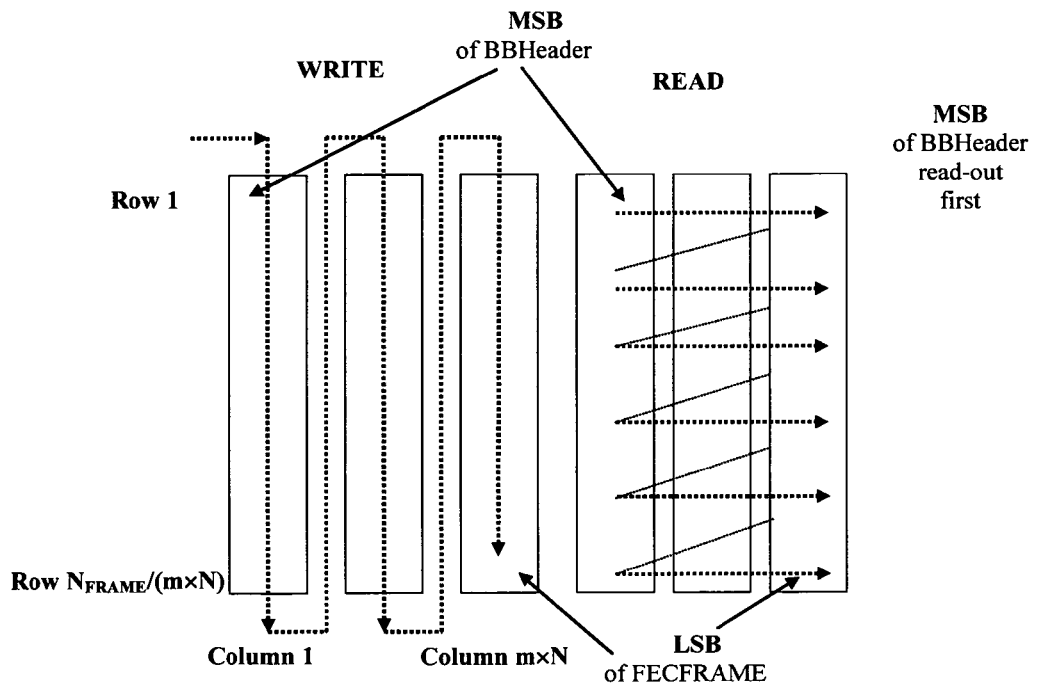
FIG. 5 is an explanatory general diagram of the interleaver of FIG. 4.

Referring now to FIG. 4, there is shown a much simplified block diagram of a system for processing a modulating digital signal, wherein an "Encoder" block receives a modulating information stream and outputs an encoded information stream organised in packets consisting of $N_{FRAME}$ bits, which may be either 64,800 or 16,200; the code employed is the LDPC code of the DVB-S2 standard.

In an "Interleaver" block, said packets are written into an interleaving matrix having a total size $N_{FRAME}$; said matrix is constituted by m×N columns and $N_{FRAME}$/m×N rows.

A "Demux" block carries out a permutation of the bits received from the "Interleaver" block; such bits are received by the interleaving matrix in groups of m×N bits at a time, where N is the number of bits carried by the constellation (N=10 for 1024QAM, N=12 for 4096QAM), and "m" is an integer greater than or equal to 1. The "Demux" block associates them in m groups of N bits and permutes them according to predetermined schemes by taking into account the type of modulation (i.e. the QAM level), the code and the type of transmission channel, and then it outputs them.

Figure 3A:
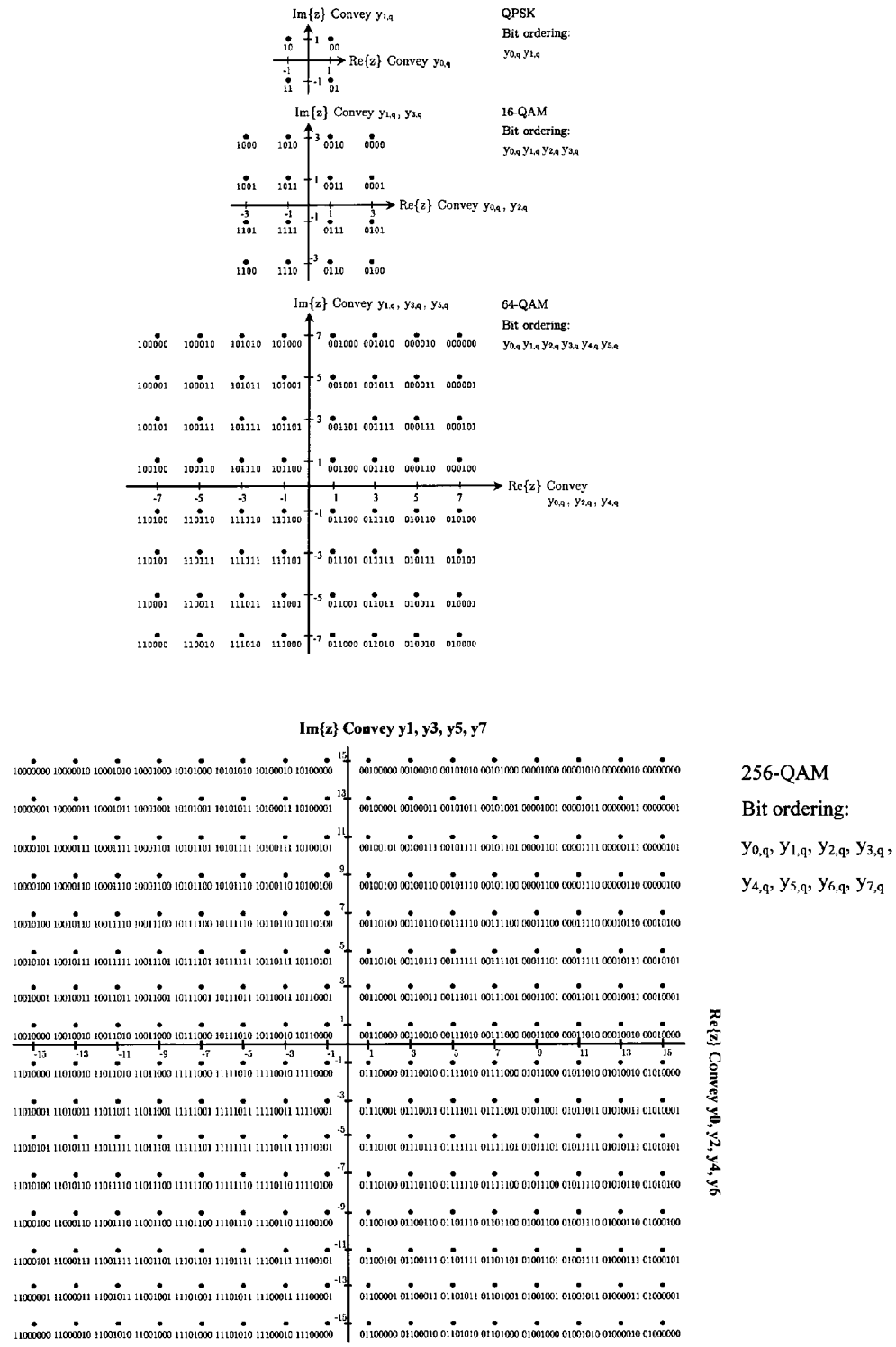
FIG. 3a is a schematic representation of the QPSK, 16QAM, 64QAM and 256QAM constellations applicable to the reception and transmission of audio and video signals involved in the broadcasting of second-generation digital television signals over cable networks.
Figure 3B:
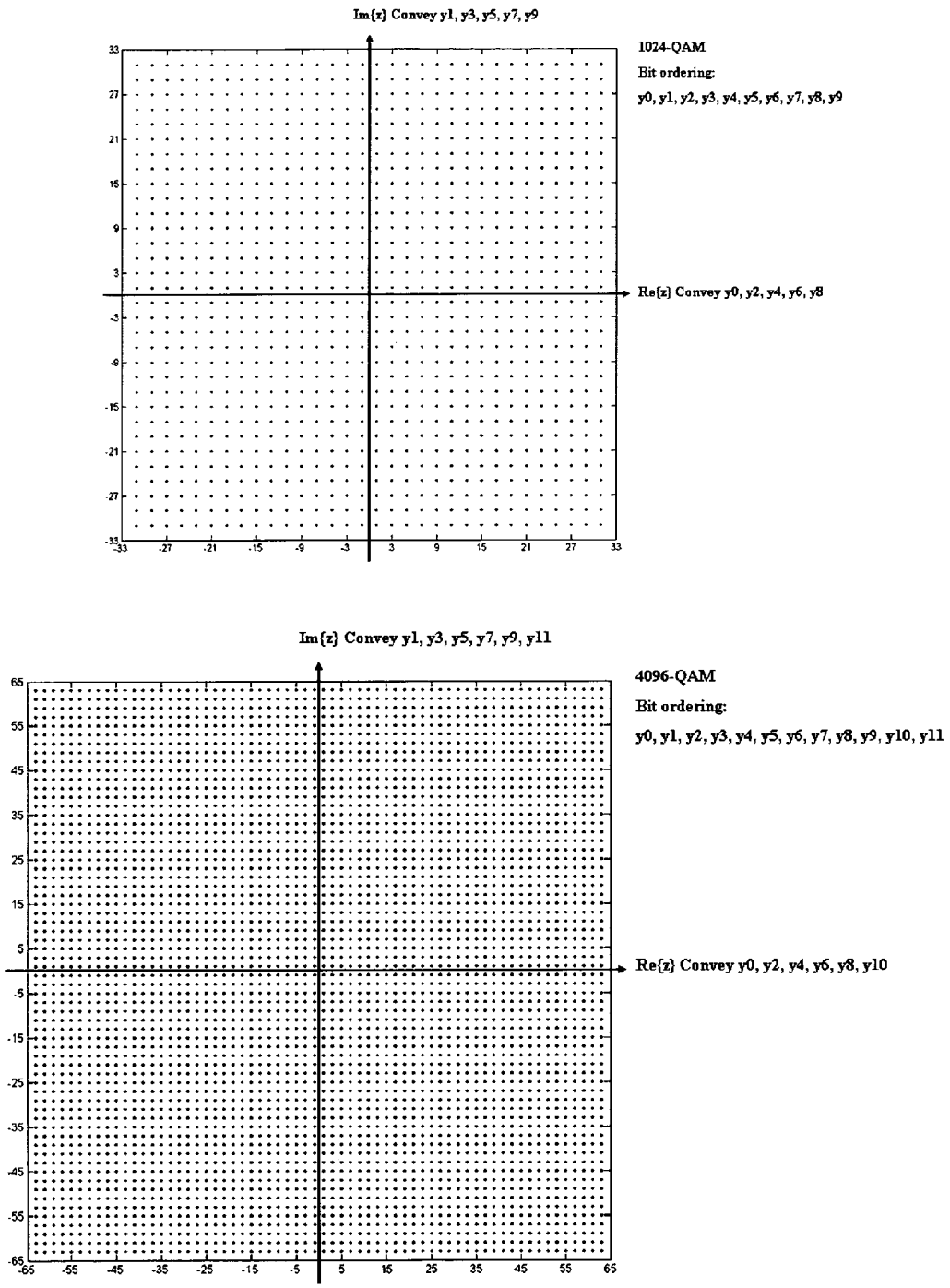
FIG. 3b is a schematic representation of the 1024QAM and 4096QAM constellations applicable to the reception and transmission of audio and video signals involved in the broadcasting of second-generation digital television signals over cable networks.

A "Mapper" block associates the N-ples of bits outputted by the "Demux" block with the points or coordinates of the constellation, e.g. as shown in FIGS. 3a and 3b and in FIGS. 10a to 10m for QAM modulations.

It is worth pointing out that the blocks shown in FIG. 4 are only those which are essential for understanding the present invention; it should not therefore be excluded the presence of intermediate blocks, e.g. located between the "Demux" block and the "Mapper" block, adapted to perform specific signal processing functions.

The present invention proposes particular permutation schemes which may be adopted for the QAM modulations and LDPC codes having different code rates provided, for example, by the DVB-S2 standard in association with different types of interleaving.

The preferred embodiment of the present invention refers to the 1024QAM and 4096QAM modulations and to the LDPC code of the DVB-S2 standard.

Figure 1:
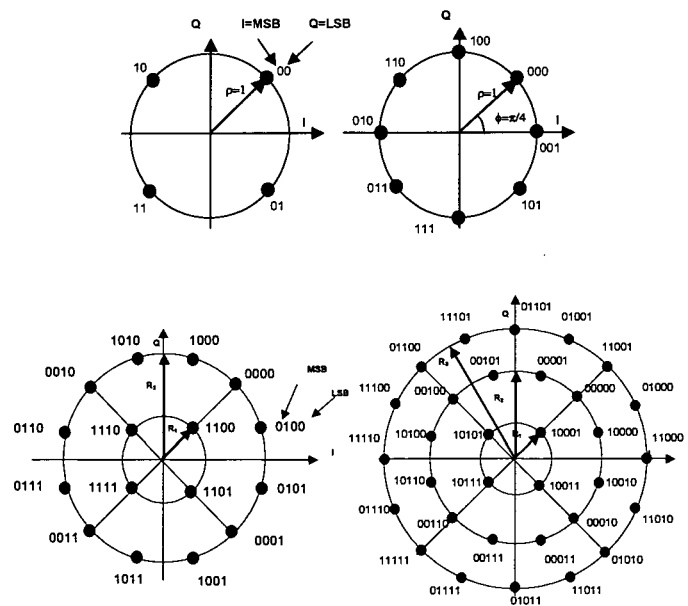
FIG. 1 is a schematic representation of the QPSK, 8PSK, 16APSK and 32APSK constellations included, among others, in the DVB-S2 standard.
Figure 2:
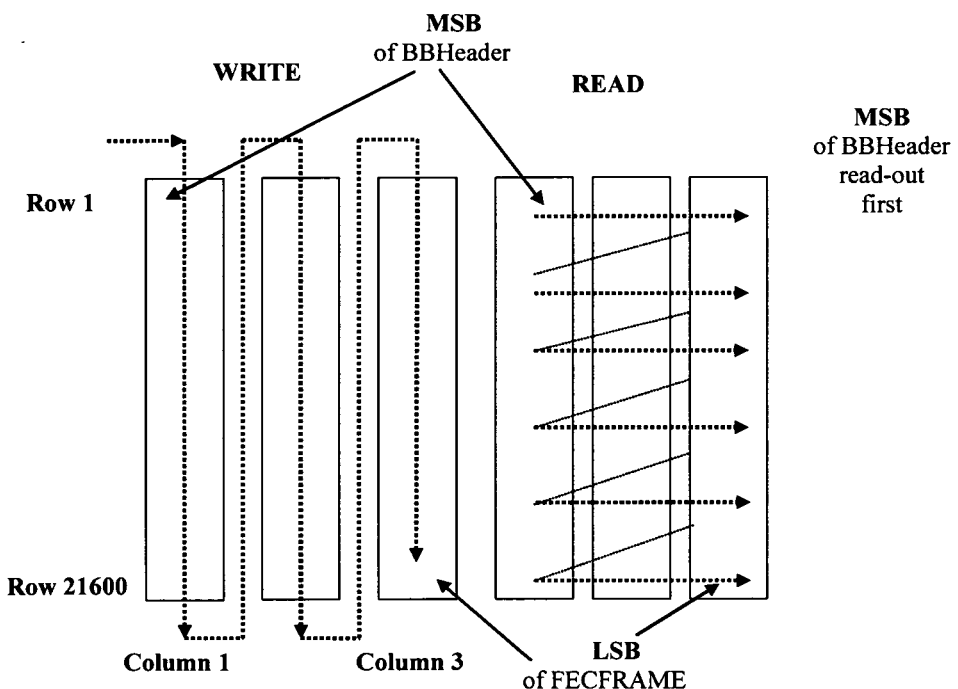
FIG. 2 is an explanatory diagram of an interleaver provided by the DVB-S2 standard, with reference to 8PSK modulation.

The preferred embodiment of the present invention employs an interleaver which is equal or similar to the one of the DVB-S2 standard as shown in FIG. 2, with a number of bits/columns dependent on the QAM modulation level type.

The present invention provides for using a matrix interleaver in the form of a matrix having 2×N columns and $N_{FRAME}$/(2×N) rows, written by columns from top to bottom and read by rows from left to right. In this case, the "Demux" block operates with m equal to 2.

For 1024QAM modulation, the 2×N bits inputted to the "Demux" block are permuted as specified in any of FIGS. 6a to 6d, and are associated with 2 consecutive symbols of 1024QAM modulation.

Given the 2×N bits b0 to b19, the 2×N bits carried by the 1024QAM constellation y0 to y19 are determined by applying the method described in detail below.

A first symbol consists of the bits b0, b2, b4, b6, b8, b10, b12, b14, b16, b18, and a second symbol consists of the bits b1, b3, b5, b7, b9, b11, b13, b15, b17, b19. Each symbol is mapped individually by arranging the bits first on the in-phase portion (I) from the least significant bit (LSB) to the most significant bit (MSB), and subsequently on the quadrature portion (Q) from the MSB to the LSB, as shown in FIG. 8a. $I_{b,1}$ and $Q_{b,1}$ respectively designate the arrays of bits associated with the bits $I_{y1}$ carried by the in-phase component and with the bits $Q_{y1}$ carried by the quadrature component of the first symbol; $I_{b2}$, $Q_{b2}$, $I_{y2}$, $Q_{y2}$ have the same meaning for the second symbol.

As an alternative, the bits may be associated with the QAM symbols as follows: $I_{y,1}=I_{b,2}$, $Q_{y,1}=Q_{b,2}$, $I_{y,2}=I_{b,1}$, $Q_{y,2}=Q_{b,1}$.

The bits belonging to the pairs (b1,b3) and (b11,b19) are then exchanged; FIG. 8b will thus be obtained from the example shown in FIG. 8a.

The two symbols are then interlaced in terms of in-phase and quadrature portions, e.g. as shown in FIG. 8c, which is obtained from the example of FIG. 8b.

As an alternative, the bits may be associated with the QAM symbols as follows: $I_{y,1}=I_{b,2}$, $Q_{y,1}=Q_{b,1}$, $I_{y,2}=I_{b,1}$, $Q_{y,2}=Q_{b,2}$.

Afterwards, the bits associated with the even locations y2, y6, y10, y14, y18 or odd locations y0, y4, y8, y12, y16 on the in-phase portion are respectively exchanged with those associated with the even locations y3, y7, y11, y15, y19 or odd locations y1, y5, y9, y13, y17 on the quadrature portion. FIG. 8d will thus be obtained from the example shown in FIG. 8c.

Figure 6A:
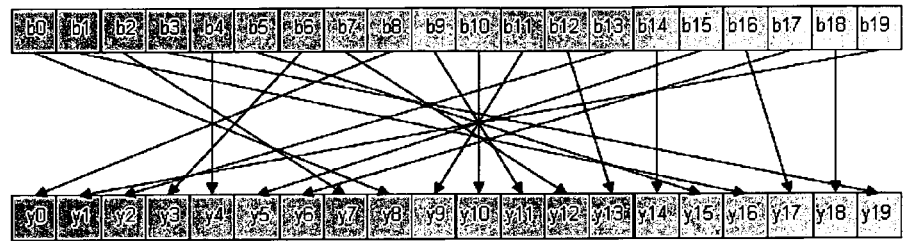
FIGS. 6a to 6d schematically show the function carried out by the "Demux" block of FIG. 4 according to four preferred embodiments of the present invention relating to 1024QAM modulation.

A first preferred embodiment relating to the 1024QAM constellation is the one listed in FIG. 8d and illustrated in FIG. 6a, according to which, given the 2×N bits b0 to b19, the 2×N bits carried by the 1024QAM constellation y0 to y19 are determined as follows:

y0=b8, y1=b19, y2=b13, y3=b6, y4=b4, y5=b15, y6=b17, y7=b2, y8=b0, y9=b11, y10=b10, y11=b9, y12=b7, y13=b12, y14=b14, y15=b5, y16=b1, y17=b16, y18=b18, y19=b3 where b0 and y0 are the most significant bits [MSB], and b19 and y19 are the least significant bits [LSB].

In particular, the "Mapper" block receives the bits y0 to y9 first, followed by the bits y10 to y19.

By using the above-mentioned alternatives, three more preferred embodiments can be obtained.

Figure 6B:
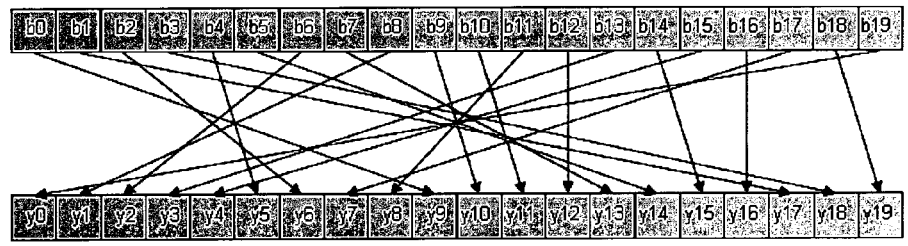

The second preferred embodiment is the one shown in FIG. 6b, wherein the bits y0 to y19 are determined as follows:

y0=b19, y1=b8, y2=b6, y3=b13, y4=b15, y5=b4, y6=b2, y7=b17, y8=b11, y9=b0, y10=b9, y11=b10, y12=b12, y13=b7, y14=b5, y15=b14, y16=b16, y17=b1, y18=b3, y19=b18.

Figure 6C:
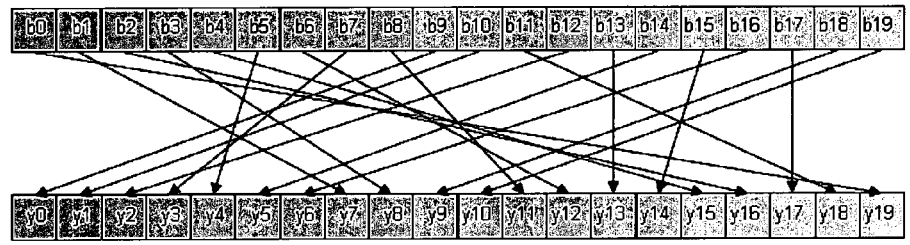

The third preferred embodiment is the one shown in FIG. 6c, wherein the bits y0 to y19 are determined as follows:

y0=b9, y1=b10, y2=b12, y3=b7, y4=b5, y5=b14, y6=b16, y7=b1, y8=b3, y9=b18, y10=b19, y11=b8, y12=b6, y13=b13, y14=b15, y15=b4, y16=b2, y17=b17, y18=b11, y19=b0.

Figure 6D:
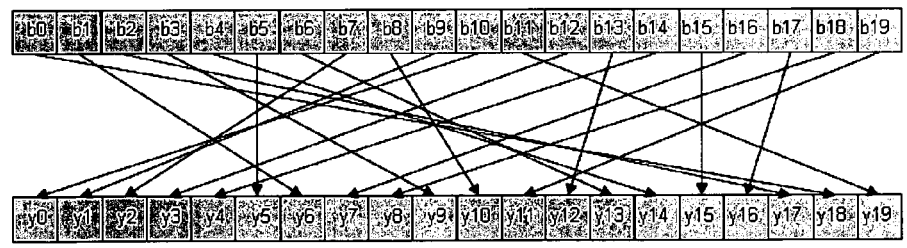

The fourth preferred embodiment is the one shown in FIG. 6d, wherein the bits y0 to y19 are determined as follows:

y0=b10, y1=b9, y2=b7, y3=b12, y4=b14, y5=b5, y6=b1, y7=b16, y8=b18, y9=b3, y10=b8, y11=b19, y12=b13, y13=b6, y14=b4, y15=b15, y16=b17, y17=b2, y18=b0, y19=b11.

Still referring to the case wherein the "Demux" block operates with m equal to 2, there are some permutations which have proven to be advantageous for the 4096QAM constellation; the 2×N bits inputted to the "Demux" block are permuted as specified in any of FIGS. 7a to 7d, for 4096QAM modulation encoded according to the LDPC code of the DVB-S2 standard, and are associated with two consecutive symbols of 4096QAM modulation. The method for obtaining the configurations shown in FIGS. 7a to 7d will now be described in detail.

Given the 2×N bits b0 to b23, a first symbol consists of the bits b0, b2, b4, b6, b8, b10, b12, b14, b16, b18, b20, b22, and a second symbol consists of the bits b1, b3, b5, b7, b9, b11, b13, b15, b17, b19, b21, b23. Each symbol is mapped individually by arranging the bits first on the in-phase portion (I) from the LSB to the MSB, and subsequently on the quadrature portion (Q) from the MSB to the LSB, as shown in FIG. 9a.

As an alternative, the bits may be associated with the QAM symbols as follows: $I_{y,1}=I_{b,2}$, $Q_{y,1}=Q_{b,2}$, $I_{y,2}=I_{b,1}$, $Q_{y,2}=Q_{b,1}$.

The bits belonging to the pairs b1, b3 and b13, b23 are then exchanged; FIG. 9b will thus be obtained from the example shown in FIG. 9a.

The two symbols are then interlaced in terms of in-phase and quadrature portions; for example, the table of FIG. 9c will thus be obtained from FIG. 9b.

As an alternative, the bits may be associated with the QAM symbols as follows:

$I_{y,1}=I_{b,2}$, $Q_{y,1}=Q_{b,1}$, $I_{y,2}=I_{b,1}$, $Q_{y,2}=Q_{b,2}$.

Afterwards, the bits associated with the even locations y2, y6, y10, y14, y18, y22 or odd locations y0, y4, y8, y12, y16, y20 on the in-phase portion are respectively exchanged with those associated with the even locations y3, y7, y11, y15, y19, y23 or odd locations y1, y5, y9, y13, y17, y21 on the quadrature portion. For example, the table of FIG. 9d will thus be obtained from FIG. 9c.

Figure 7A:
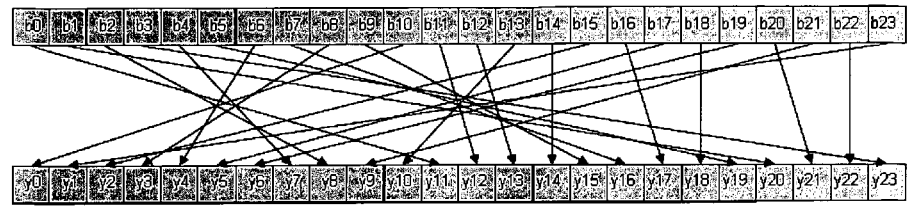
FIGS. 7a to 7d schematically show the function carried out by the "Demux" block of FIG. 4 according to four preferred embodiments of the present invention relating to 4096QAM modulation.
Figure 7B:
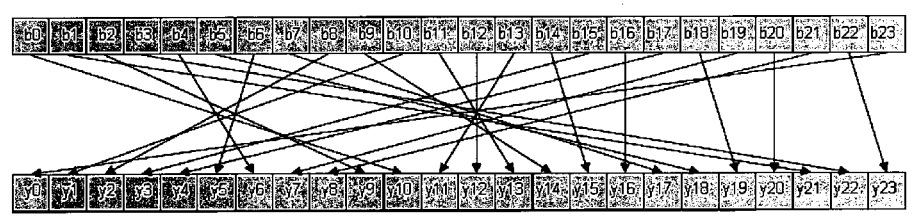

A first preferred embodiment relating to the 4096QAM constellation is the one listed in FIG. 9d and illustrated in FIG. 7a, according to which, given the 2×N bits b0 to b23, the 2×N bits carried by the 4096QAM constellation y0 to y23 are determined as follows:

y0=b10, y1=b23, y2=b15, y3=b8, y4=b6, y5=b17, y6=b19, y7=b4, y8=b2, y9=b21, y10=b13, y11=b0, y12=b11, y13=b12, y14=b14, y15=b9, y16=b7, y17=b16, y18=b18, y19=b5, y20=b1, y21=b20, y22=b22, y23=b3

By using the above-mentioned alternatives, three more preferred embodiments can be obtained. The second preferred embodiment is the one shown in FIG. 7b, wherein the bits y0 to y23 are determined as follows:

y0=b23, y1=b10, y2=b8, y3=b15, y4=b17, y5=b6, y6=b4, y7=b19, y8=b21, y9=b2, y10=b0, y11=b13, y12=b12, y13=b11, y14=b9, y15=b14, y16=b16, y17=b7, y18=b5, y19=b18, y20=b20, y21=b1, y22=b3, y23=b22

Figure 7C:
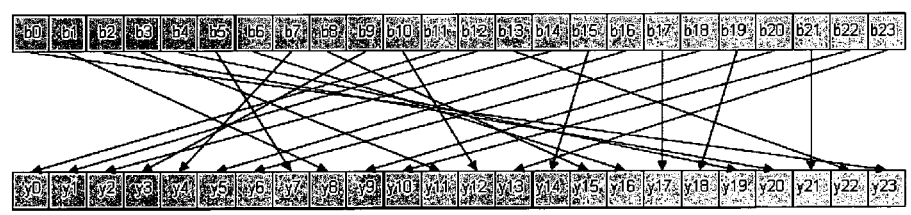

The third preferred embodiment is the one shown in FIG. 7c, wherein the bits y0 to y23 are determined as follows:

y0=b11, y1=b12, y2=b14, y3=b9, y4=b7, y5=b16, y6=b18, y7=b5, y8=b1, y9=b20, y10=b22, y11=b3, y12=b10, y13=b23, y14=b15, y15=b8, y16=b6, y17=b17, y18=b19, y19=b4, y20=b2, y21=b21, y22=b13, y23=b0

Figure 7D:
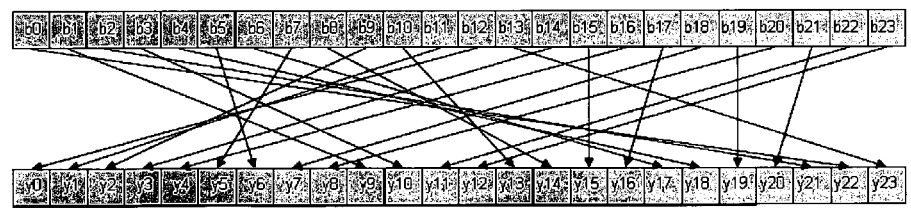

The fourth preferred embodiment is the one shown in FIG. 7d, wherein the bits y0 to y23 are determined as follows:

y0=b12, y1=b11, y2=b9, y3=b14, y4=b16, y5=b7, y6=b5, y7=b18, y8=b20, y9=b1, y10=b3, y11=b22, y12=b23, y13=b10, y14=b8, y15=b15, y16=b17, y17=b6, y18=b4, y19=b19, y20=b21, y21=b2, y22=b0, y23=b13

The above-described methods may be used to advantage in a system for transmitting digital signals based on a 1024QAM or 4096QAM modulator, and particularly in an audio/video digital signal transmitter for broadcasting digital television signals over cable networks.

As is apparent to those skilled in the art, if the above-described method is applied in transmission, a reverse method will have to be applied in reception.

As known, the transmission of television signals is carried out by radio frequency transmitters, while the reception of television signals occurs through television receivers typically installed in the television service users' homes.

The invention claimed is:

1. Method for processing bits to be sent to a QAM modulator, said bits being encoded by an encoder according to an LDPC code and being subject to row-column interleaving using an interleaving matrix, wherein a bit permutation is carried out prior to the constellation mapping function, characterised in that said modulator is of the 1024QAM type, said interleaving matrix has 2*N columns and $N_{FRAME}/(2*N)$ rows, wherein N depends on the modulation type and N=10 for 1024QAM modulation type, and wherein $N_{FRAME}$ represents the number of bits of an encoded packet output by the encoder, and said bit permutation is carried out on 20-bit words of the row-column interleaved bits and consists in generating a word Y comprising the bits y0 y1 y2 y3 y4 y5 y6 y7 y8 y9 y10 y11 y12 y13 y14 y15 y16 y17 y18 y19, in this order, starting from a word B comprising the bits b0 b1 b2 b3 b4 b5 b6 b7 b8 b9 b10 b11 b12 b13 b14 b15 b16 b17 b18 b19, in this order, the bits y0 and b0 being respectively the most significant bits of the words Y and B, and the bits y19 and b19 being respectively the least significant bits of the words Y and B, and wherein:

y0=b8, y1=b19, y2=b13, y3=b6, y4=b4, y5=b15, y6=b17, y7=b2, y8=b0, y9=b11, y10=b10, y11=b9, y12=b7, y13=b12, y14=b14, y15=b5, y16=b1, y17=b16, y18=b18, y19=b3.

2. System for transmitting digital signals comprising a QAM modulator, characterized in that it comprises means for carrying out the method according to claim 1.

3. Method for processing bits received by a QAM demodulator, wherein a bit permutation is carried out after the constellation demapping function said bits being subject to row-column de-interleaving using a de-interleaving matrix and being decoded by a decoder according to an LDPC code, characterised in that said demodulator is of the 1024QAM type, said de-interleaving matrix has 2*N columns and $N_{FRAME}/(2*N)$ rows, wherein N depends on the demodulation type and N=10 for 1024QAM demodulation type, and wherein $N_{FRAME}$ represents the number of bits of a demodulated packet input to the decoder, and in that said bit permutation is carried out on 20-bit words of the row-column de-interleaved bits and consists in generating a word B comprising the bits y0 y1 y2 y3 y4 y5 y6 y7 y8 y9 y10 y11 y12 y13 y14 y15 y16 y17 y18 y19, in this order, starting from a word Y comprising the bits b0 b1 b2 b3 b4 b5 b6 b7 b8 b9 b10 b11 b12 b13 b14 b15 b16 b17 b18 b19, in this order, the bits y0 and b0 being respectively the most significant bits of the words Y and B, and the bits y19 and b19 being respectively the least significant bits of the words Y and B, wherein:

y0=b8, y1=b19, y2=b13, y3=b6, y4=b4, y5=b15, y6=b17, y7=b2, y8=b0, y9=b11, y10=b10, y11=b9, y12=b7, y13=b12, y14=b14, y15=b5, y16=b1, y17=b16, y18=b18, y19=b3.

4. System for receiving digital signals comprising a QAM demodulator, characterized in that it comprises means for carrying out the method according to claim 3.

* * * * *

UNITED STATES PATENT AND TRADEMARK OFFICE
CERTIFICATE OF CORRECTION

PATENT NO. : 8,385,445 B2  Page 1 of 1
APPLICATION NO. : 12/999274
DATED : February 26, 2013
INVENTOR(S) : Vitale et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 322 days.

Signed and Sealed this
First Day of September, 2015

Michelle K. Lee
*Director of the United States Patent and Trademark Office*